United States Patent
Gofman et al.

(10) Patent No.: US 6,189,130 B1
(45) Date of Patent: Feb. 13, 2001

(54) SYSTEM AND METHOD FOR DETERMINING DENSITY MAPS IN HIERARCHICAL DESIGNS

(75) Inventors: Emanuel Gofman, Haifa (IL); Franklin Gracer, Yorktown Heights, NY (US); Ehud Dov Karnin, Koranit (IL); Mark A. Lavin, Katonah, NY (US); Dov Ramm, Menashe (IL)

(73) Assignee: International Business Machines Corporation, Armonk, NY (US)

( * ) Notice: Under 35 U.S.C. 154(b), the term of this patent shall be extended for 0 days.

(21) Appl. No.: 09/070,482

(22) Filed: Apr. 30, 1998

(51) Int. Cl.[7] .................................................. G06F 15/46
(52) U.S. Cl. ..................................................... 716/7
(58) Field of Search ............................................ 716/7, 14

(56) References Cited

U.S. PATENT DOCUMENTS 5,528,508   6/1996  Russell et al. ........................ 364/488
6,002,857 * 12/1999  Ramachandran ......................... 716/7

OTHER PUBLICATIONS

Hanan Samet. "Hierarchical Representations of Collections of Small Rectangles", acm computing surveys. vol. 20. No. 4, Dec. 1988, pp. 271–309.

Kahng et al., "Filling and Slotting: Analysis aNd Algorithms*", International Symposium on Physical Design, 1998.

* cited by examiner

Primary Examiner—Paul R. Lintz
Assistant Examiner—Thuan Do
(74) Attorney, Agent, or Firm—F. Chau & Associates, LLP

(57) ABSTRACT

A method for calculating density maps in hierarchical designs includes the steps of deoverlapping objects in the design, providing an area of interest in the design, generating a grid in the area of interest to partition the area of interest into grid elements, determining whether the local properties of each object within the grid elements have been previously calculated, if previously calculated, adding the previously calculated value for the local properties to a corresponding grid element, otherwise, calculating the local properties of the object and summing the local properties of the objects for each associated grid element such that the local properties are calculated only once for a given object throughout the design. A system is also includes for implementing the method.

27 Claims, 8 Drawing Sheets

SYSTEM AND METHOD FOR DETERMINING DENSITY MAPS IN HIERARCHICAL DESIGNS

BACKGROUND OF THE INVENTION

1. Field of the Invention

The present invention relates to semiconductor chips and, more particularly, to a system and method for calculating density maps for hierarchical chip designs.

2. Description of the Related Art

Density maps are used in the semiconductor industry as a metric for determining manufactured chip quality. Calculating a density map for various levels of the chip design is often required in the manufacturing process; such levels correspond to different processing steps or material layers, such as diffusion, metal interconnect, etc. The density map is computed to check layout ground rules dictated by process considerations. The density map is used to condition "fill shapes" to be added to a design for the purpose of making pattern density more even across the design. The density map may also be used to condition compensation algorithms (e.g., which modify the local widths of critical features) to compensate for process variations due to variations in pattern density.

The density map is also useful for determining other important scalar properties, for example, defect susceptibility, power dissipation, etc. for purposes of modeling and/or correction for these properties. The density map also is used to estimate yield loss due to densities that are too low or too high in metal layers of the design. The density map is further used to evaluate non-uniformities in height across the chip, due to variations in density, and its effect on CMP (chemical mechanical planarization). Density map is generally about 10% to about 50% for standard designs.

A density map is determined by computing a fraction of occupied area in a given area as described in Kahng et al., Int. Smp. of Phys. Des. 1998. The occupied area is the area occupied by a shape or shapes of, for example, a device such as a transistor or a diffusion region of the transistor. This problem is closely related to a measure problem. The measure problem seeks to find the area of a collection of rectangles, where overlapping regions are only counted once. An algorithm with complexity of O (N log N), where N is the number of rectangles, has been developed in the prior art to address the measure problem.

For real designs, the calculation of density maps is often more complex than the solutions described above. Chip designs include shapes that cannot always be represented by a set of rectangles without losing accuracy. Also, the measure for real designs must be found within many grid squares. Further, the prior art approach requires flattening the design which precludes its usage for very large designs, for example in memory chips. This also precludes usage of the prior approach in devices other than memory chips, for example in processors having on-chip cache, register files, repetitive usage of large standard cells, etc.

Therefore, a need exists for a system and method for determining density maps in a highly nested (hierarchical) form. A further need exists for providing a more efficient system and method for reducing running time and memory requirements for calculating density maps.

SUMMARY OF THE INVENTION

According to the present invention, a method for calculating density maps in hierarchical designs includes the steps of deoverlapping objects in the design, providing an area of interest in the design, generating a grid in the area of interest to partition the area of interest into grid elements, determining whether the local properties of each object within the grid elements have been previously calculated, if previously calculated, adding the previously calculated value for the local properties to a corresponding grid element, otherwise, calculating the local properties of the object and summing the local properties of the objects for each associated grid element such that the local properties are calculated only once for a given object throughout the design.

In alternate methods of the present invention, the step of calculating a density map by dividing the local properties for objects in a grid element by an area of the grid element may be included. The step of deoverlapping may include altering shapes of objects to be disjoint while maintaining the local properties of the objects. The step of providing the area of interest may include the step of enclosing the area of interest by a least enclosing rectangle (LER). The step of generating a grid may include the step of generating a grid of polygons. The local properties may include areas of objects. The step of apportioning local properties of objects existing in more than one grid element to the associated grid element for each apportioned local property may be included. The objects preferably include shapes and cells. The step of apportioning areas of shapes and cells existing in more than one grid element to the associated grid element for each apportioned area may also be included. The step of calculating density maps for user specified areas within the area of interest may also be included. The steps of providing a mini-grid including mini-grid elements for each user specified area and apportioning areas of shapes determined to be in the mini-grid elements of each user specified area among the grid elements of the area of interest are preferably included.

Another method for calculating density maps in hierarchical designs includes the steps of deoverlapping objects in the design, providing an area of interest in the design, generating a grid in the area of interest to partition the area of interest into grid elements, initializing a calculated area associated with each grid element to zero, moving through objects in the hierarchy to determine if the objects are a shape or a cell, if the object is a shape, apportioning the area of the shape to associated grids elements, if the object is a cell, determining if the cell includes mini-maps, if mini-maps are included, apportioning areas of cells and shapes in the mini-map to the associated grid elements of the area of interest, if the object is a cell, determining if the instance can be further divided into smaller cells, if dividing the cells into smaller cells is possible, dividing the cells, apportioning the areas of the cells to associated grid elements.

In alternate methods of the present invention, the step of calculating a density maps by dividing the areas for shapes and cells in a grid element by an area of the grid element may be included. The step of deoverlapping may include altering shapes of the objects while maintaining the area of the objects. The step of providing the area of interest may include the step of enclosing the area of interest by a least enclosing rectangle (LER). The step of generating a grid may include the step of generating a grid of squares. The steps of bypassing a computation previously performed to determine an area for one of a same cell and a same shape and employing an area determined by a previously performed computation for shapes and cells such that the area is calculated only once for a given shape or cell throughout the design may be included. The step of selecting cells and creating density maps (mini-maps) for the selected cells and subsequent usage of these mini-maps in calculating density maps density maps for mini-maps may also be included.

A system for calculating density maps in hierarchical designs includes means for deoverlapping objects in an area of interest in the design. A grid generated in the area of interest to partition the area of interest into grid elements, each grid element including objects having local properties associated therewith is also included. Means for determining whether the local properties of each object within the grid elements have been previously calculated is included. If previously calculated, the previously calculated value is added for the local properties to a corresponding grid element. Means for calculating the local properties for the objects for newly encountered objects is included such that the local properties are calculated only once for a given object throughout the design, and the density map is determined when the local properties of the objects are summed in each grid element and divided by an associated grid element area.

In alternate embodiments of the system, a memory for storing calculated local properties for objects in an associated grid element is included. The objects may include semiconductor devices and/or mini-maps. Means for apportioning for dividing local properties of objects existing in more than one grid element may be included. A processor is preferably for summing local properties of the objects in each grid element and dividing by the associated grid element area. The local properties may include areas of the objects. The objects may include shapes and cells. The hierarchical designs may be included on integrated circuit chips.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

The present invention relates to semiconductor chips and, more particularly, to a system and method for calculating density maps for hierarchical chip designs. Density maps are provided in accordance with the present invention by computing the density of a specified level of the design. To find the density map for a given chip design, a window is defined (by a user) for an area to be mapped or a Least Enclosing Rectangle (LER) is computed which encloses all the cells of a given level or area of interest. A grid is generated within the window or LER having a user specified grid size. For each grid element, the present invention computes an area covered by shapes at a selected level. When a design is represented in hierarchical form, the present invention utilizes the repetition of the design to reduce the amount of computation and reduce the memory requirements needed to compute the density map. The repeated shapes and cells with areas or local properties previously calculated are not calculated again. Instead, the areas are stored and used for a given shape or cell. The density map is calculated in a precise manner or with a specified degree of approximation. The approximation further reduces run time without notable degradation in accuracy of the density map calculation.

Figure 1:
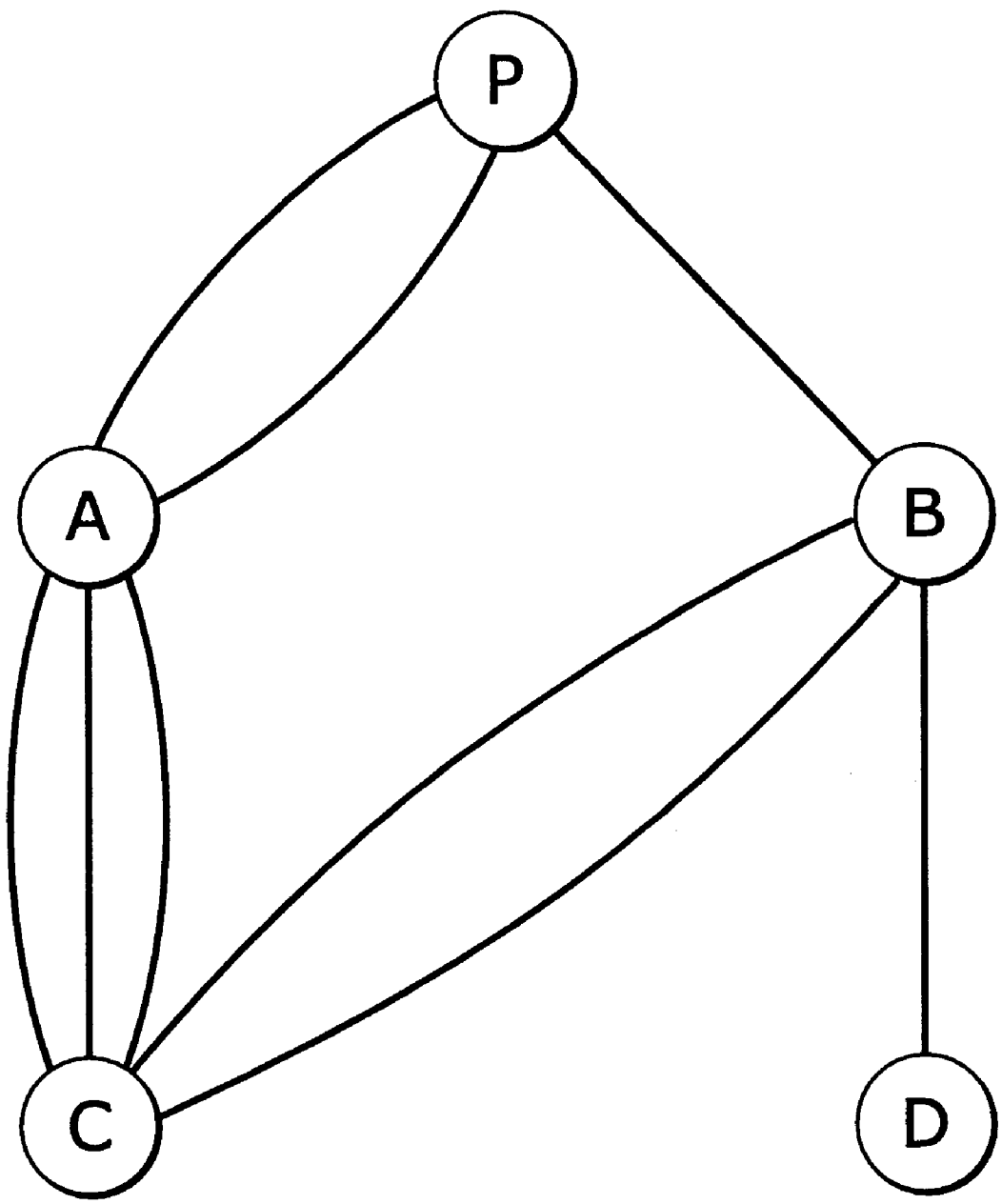
FIG. 1 is a schematic diagram showing a hierarchy of cells in an integrated circuit design.

Referring now in specific detail to the drawings in which like reference numerals identify similar or identical elements throughout the several views, and initially to FIG. 1, a hierarchy is shown for cells in a design. Beginning at a lower end of the hierarchy cells C and D are shown. Cells C and D may represent shapes or cells which include shapes in a design. Shapes generally describe features on a chip, for example, transistors or metal lines. Shapes may also describe smaller features such as representations of portions of transistors, for example a diffusion region for a source or a drain. Shapes, such as those representing a transistor, are generally repeated many times in a level of a chip and may be used in different areas of a chip level in varying amounts. Cells may include shapes and smaller cells. Cells A and B, which may represent a higher-level component such as an adder, are parent cells of cells (or shapes) C and D and therefore include the shapes therein. The shapes of cell C are used in both cell A and cell B thereby demonstrating the repetition of cells in the hierarchy. Adder cells A and B may include a plurality of child cells, for example C and D in adder cell B. In a real design, adder cells may include hundreds or thousands of devices, for example transistors or capacitors in a memory array. Adder cells A and B are included in a parent cell P. As shown in FIG. 1, cell P includes all other cells on the chip and is therefore referred to as a prime cell (or root cell). Cell P is the highest cell in the cell hierarchy in this illustrative example, however, larger cells may be used to include cell P or a plurality of cells including for example a plurality of P cells.

Figure 2:
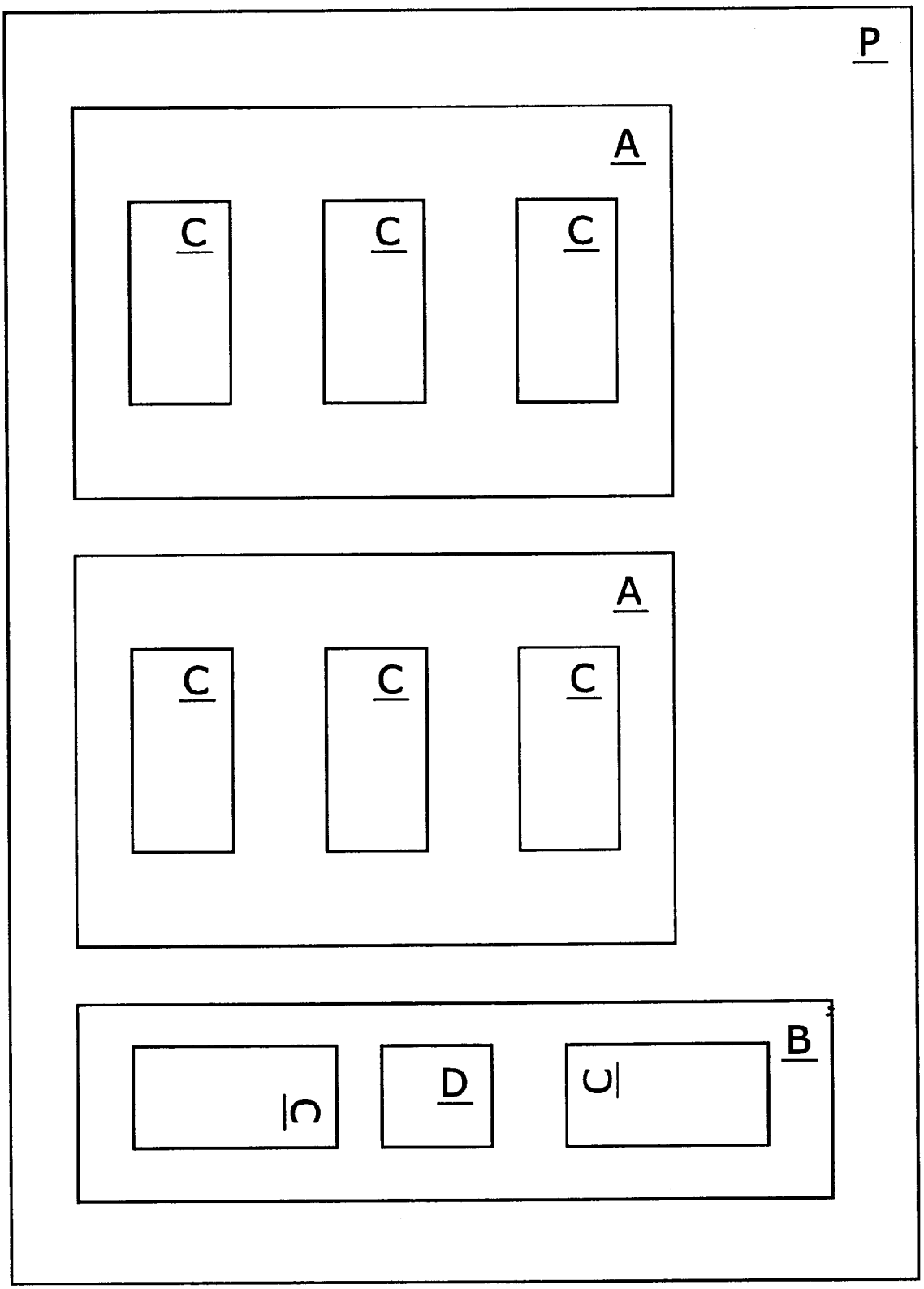
FIG. 2 is a top view of a chip showing a hierarchy of cells in an integrated circuit design.

Referring to FIGS. 1 and 2, a hierarchy is illustratively shown for a chip layout. Cell P is represented by the entire layout as shown. Cells A and B are included within cell P. Cells C and D in this instance are included in cells A and B. The cells P, A and B may include a plurality of different cells and shapes according to a hierarchical design.

Referring to the drawings, it should be understood that the elements shown in the FIGS. may be implemented in various forms of hardware, software or combinations thereof. Preferably, these elements are implemented in software on one or more appropriately functioning computers which may include programmed general purpose processors, memory and input/output interfaces.

Figure 3:
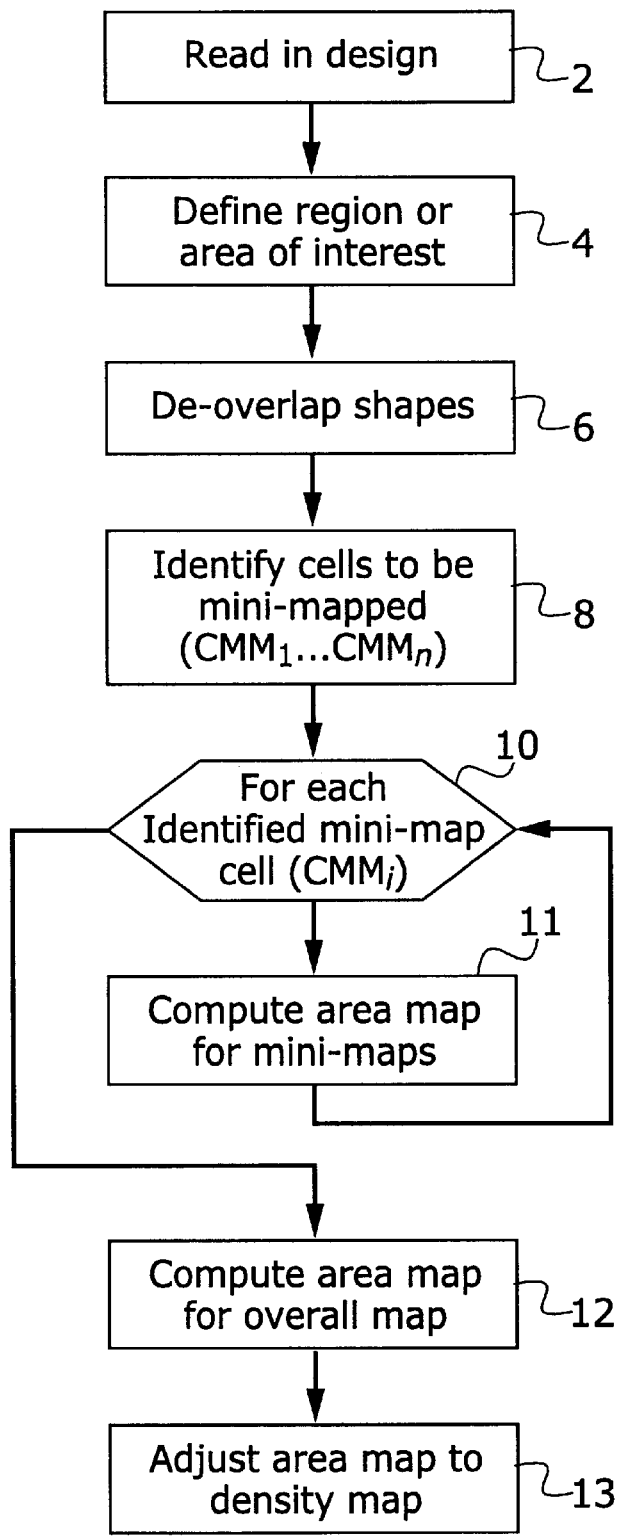
FIG. 3 is a block/flow diagram for a system and method in accordance with the present invention.

A method and system will now be illustratively described in accordance with the present invention. With reference to FIG. 3, a hierarchical design represented in the industry-standard GDS II format or equivalent, is read from a disk file in block 2. In block 4, a window is defined by selecting an area of interest on a level of the chip. The window may be user defined to set boundaries manually for an area of interest or determined by an adjustable boundary for example a Least Enclosing Rectangle (LER). The LER may be a default window if a user defined window is not provided. A level of interest in a chip design is identified and shapes within the identified level deoverlapped in block 6. Deoverlapping may be performed efficiently and leave the resulting design nested using processes such as those described by Russell and Weinert, in U.S. Pat. No. 5,528,508 hereby incorporated by reference for all purposes. The present method preferably includes deoverlapping shapes in cells to provide a more efficient solution. Conventional methods blend overlapping shapes for example two regions of polycrystalline silicon on a memory chip, to simplify calculations. In so doing, the convention methods do not provide a result as accurate as that of the present invention. One useful process for deoverlapping includes changing dimensions of shapes to deoverlap without changing an area of the shape. Deoverlapping exploits the hierarchical nesting in a design representation without unraveling the design itself.

Figure 4:
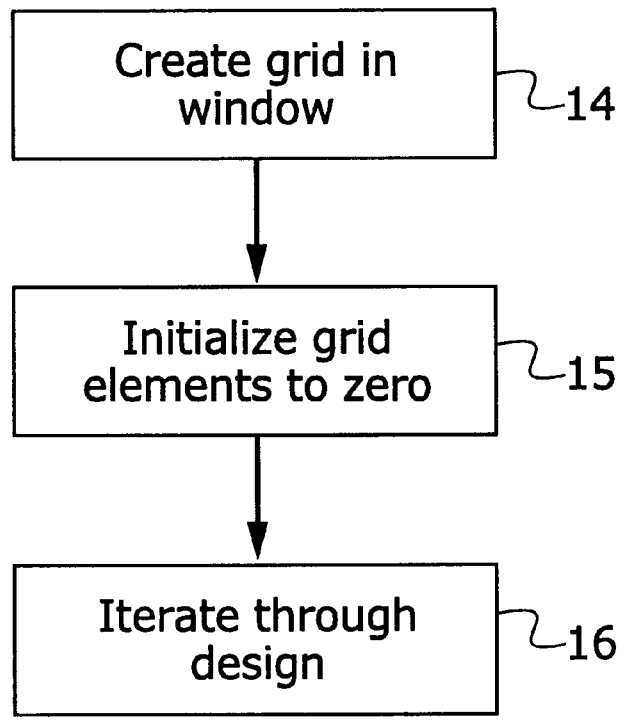
FIG. 4 is a block/flow diagram for computing an area map for a cell in accordance with the present invention.

The efficiency of the overall density map computation may be improved by selecting a set of cells, i.e $\{CMM_1, \ldots CMM_n\}$ for which are computed "mini-area-maps" or "mini-maps", that is, area maps for those cells viewed as individual hierarchical designs. The "mini-maps" computation is performed using the method of the present invention. As shown in FIG. 3, cells to be "mini-mapped" are identified in block 8. In block 10, each of the identified cells is encountered and, the area is calculated and applied to the mini-map in block 11. The identified cells may include $CMM_i$, mini-grids, LER for $CMM_i$, etc. The cells to be "mini-mapped" may be designated by the user or selected automatically by a criteria that is calculated by a formula that considers cells' areas, number of uses, etc. In block 11, the method as described in FIG. 4 is used for each "mini-map". In block 12, once the areas for each "mini-map", if any, are computed, the area map for the design as a whole (i.e., the overall map which may include the area of interest, the prime cell or a full grid) is computed as described in greater detail in FIG. 4. In block 13, the resulting area map is converted to a density map by dividing the accumulated area for each grid element by the area covered by the grid element. In other words, when the iteration through all the cells (and shapes) to the prime cell is completed, the level area (for the shapes therein) for each grid element is found. The density map is then calculated to be a fraction of: occupied space in each grid element to the grid element area.

Referring to FIG. 4, in block 14, an area of interest is identified for which an area map is desired. A window placed over the area of interest or an LER is computed. The window or LER is partitioned into a grid comprising grid elements. The grid element size may be selected by a user depending on the accuracy or performance desired for a particular design. The grid elements are polygons, preferably rectangles, however, other shapes are contemplated, for example squares, triangles, hexagons, etc. The window is completely covered by grid elements. A covered grid area for each grid element is initialized to zero in block 15.

In block 16, beginning with a specified cell (for example, one of the mini-mapped cells $\{CMM_i\}$ or a prime (or root) cell for the whole design) the method moves through the hierarchy to determine density maps for each grid element. Cell areas (and/or shape areas) are calculated (if the areas have not yet been calculated in a previous steps) such that areas are calculated only once. The areas are added to grid elements in which the shapes or cells are located or apportioned between grid elements when a cell/shape exists in more than one grid element. If a shape does not belong to one grid element and is "too big" to be apportioned, it is intersected with the grid element, and the area in intersection is added. If a cell does not belong to one grid element and is "too big" to be apportioned, the method moves down in the hierarchy.

Figure 5:
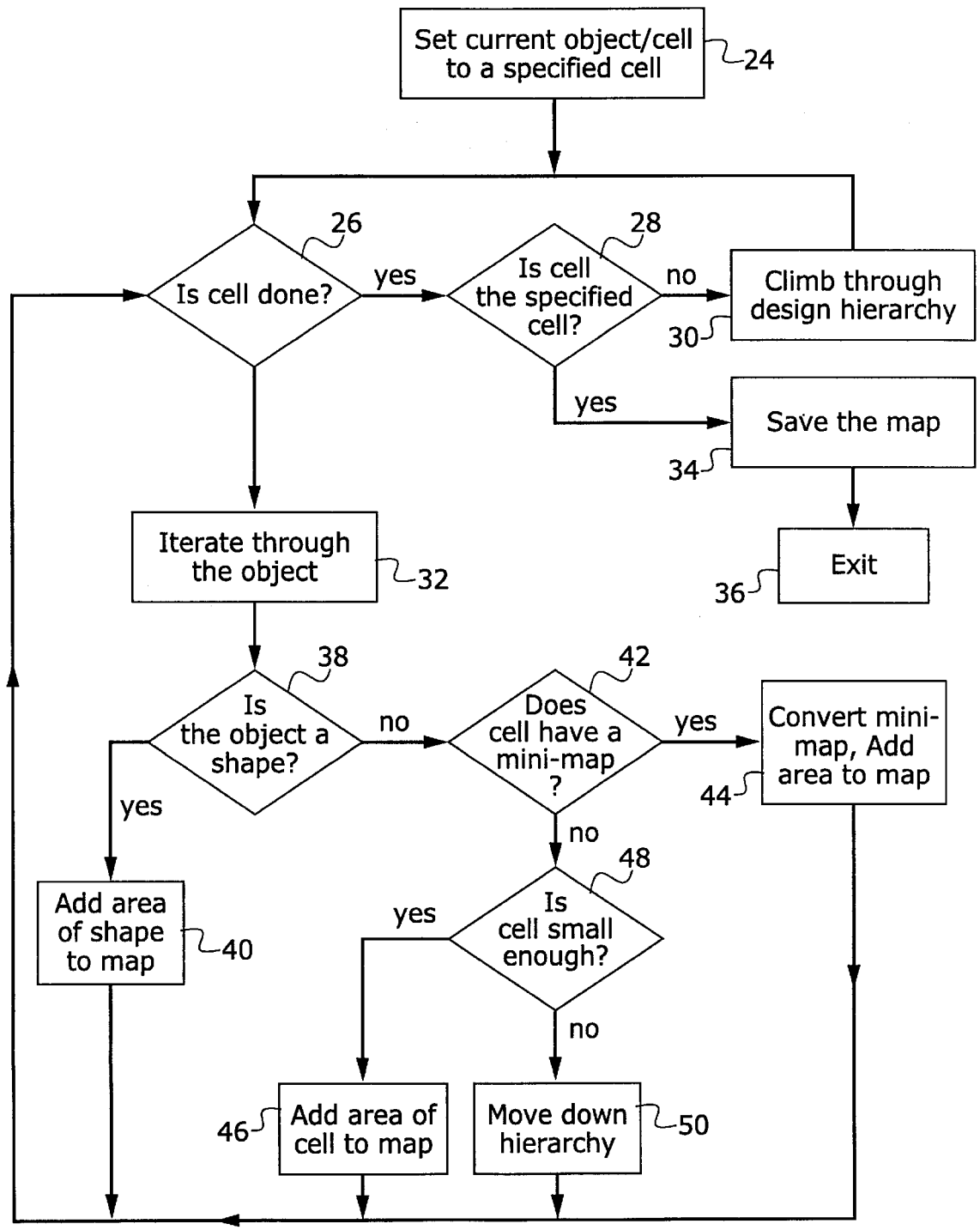
FIG. 5 is a block/flow diagram for computing an area map for a cell in accordance with the present invention.

Block 16 is described in further detail as shown in FIG. 5. In block 24, the method sets a current object (cell) to the specified cell. The method iterates through the design, for example, the grid or the window. If all the areas (i.e. cell areas) have been calculated for the shapes/cells of a given cell the cell is "done". In decision block 26, the current cell is tested, if "done" the path is directed to decision block 28. In decision block 28, it is determined if the current object is the specified cell. If it is not the specified cell, the hierarchy is climbed until the specified cell is found and all cells are "done". When all cells are "done" and the specified cell is the current cell the method is complete. In block 28, if the cell is not the specified cell, the design hierarchy is climbed to a next level for a new current cell and the path is returned to block 26. If the current cell is the specified cell, the map is saved in block 34 and the method is exited in block 36. If the current cell is not "done" in block 26, block 32 begins the iterations through the cell's objects.

In decision block 38, it is determined if the next object is a shape. If it is a shape, its area is added to the map in block 40. This means that the area is calculated and added to the grid element or elements in which the shape is located. If it is determined in block 38 that the current instance is not a shape, decision block 42 is encountered where it is determined whether or not the a mini-map exists and whether it can be used for the current instance as described with reference to FIG. 3. If a mini-map exists in the current instance, the mini-map is added to the overall map (the map) in block 44 where the cell mini-map is transformed by the same transform by which the cell instance is transformed by the same transform by which the cell instance is transformed, and the mini-map areas are added to the map. If no mini-map exists in the current instance, decision block 48 decides whether the current instance is small enough to add to the map. The current instance is small enough if it meets predetermined criteria set by the user. For example, a cell may be considered small enough if the maximum dimension of the cell's LER is less than about ½ the grid size. Any cell smaller than this would be considered small enough in block 48 to add the cell's area to the map in block 46. In any case, a cell instance which is covered entirely by one grid element is processed in block 46. If the current instance is deemed not small enough in block 48, the cell will be analyzed at the next lower level of the hierarchy, i.e. smaller cells or shapes.

To cover the remaining cells and shapes in the design, blocks 40, 44, 46 and 50 return the program path to block 26 where the process continues until all cells are "done" and the grid elements include calculated areas for shapes therein such that density maps may be calculated for the design or portion thereof.

Figure 6:
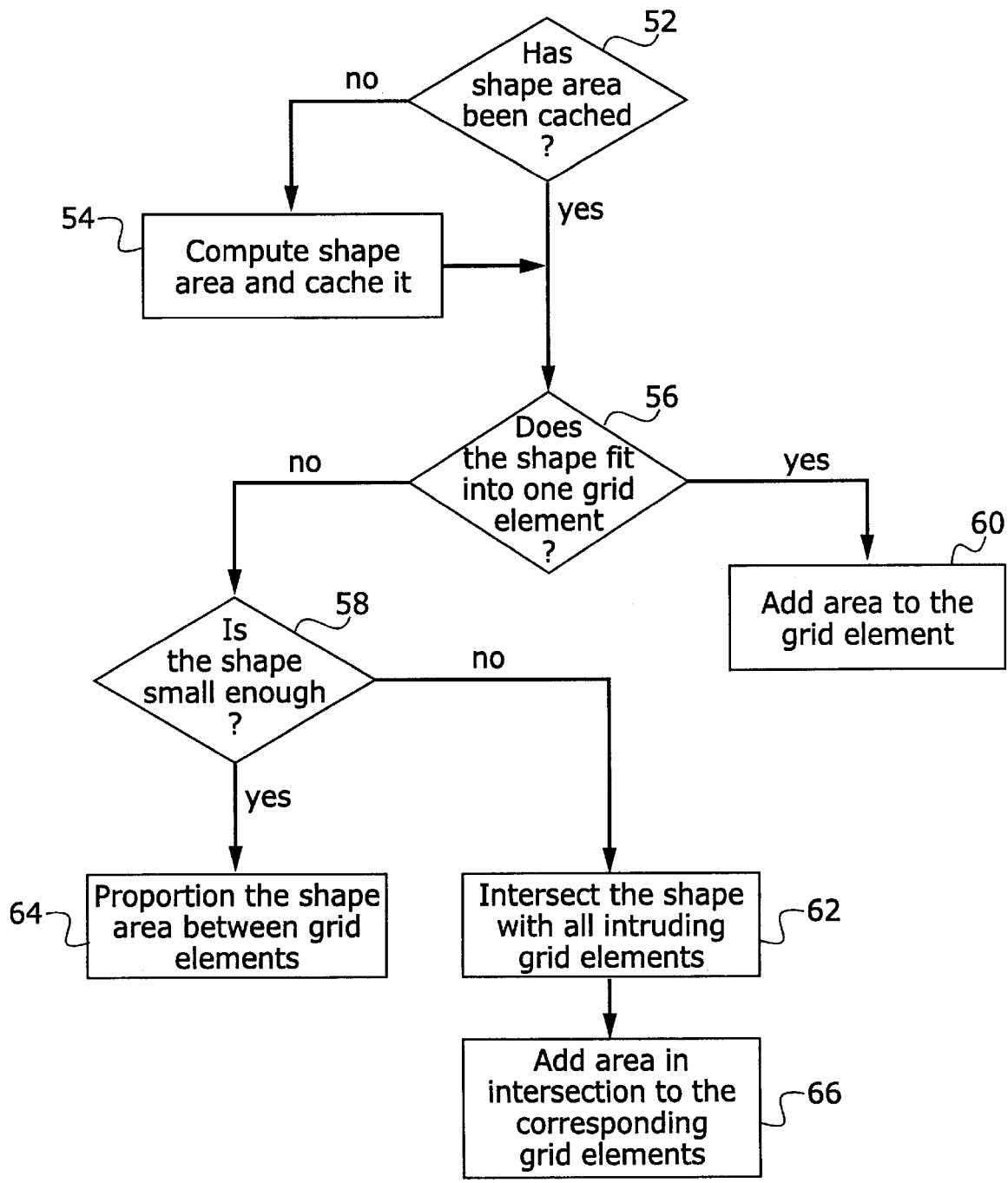
FIG. 6 is a block/flow diagram for adding shape areas to a map in accordance with the present invention.

Block 40 of FIG. 5 is now described in further detail with reference to FIG. 6. In decision block 52, it is determined whether the current object, i.e, a shape, has an area calculated and saved in the appropriate grid element. In other words, has the area of the shape been cached? If the area has not been cached, the area is computed and cached in block 54. If the area has been cached, a decision block 56 is encountered where it is determined whether the shape fits into one grid element. If the shape fits into one grid element, the area of the shape is added, in block 60, to the map in the appropriate grid element. If the shape does not fit into one grid element, the shape is compared to a predetermined user defined criterion. If the shape is less than the criterion, i.e. small enough, then the shape's area is proportioned between the grid elements into which the shape extends into in block 64. The apportioning may be performed in the following way. A LER is created for the shape, and if, for example, 30% of the LER area is in a first grid element and 70% is in a second grid element, the area is proportioned accordingly between the first and second grid elements. "Small enough" may be determined when the cell's LER is smaller than a user specified value, or the LER of the cell instance fits in one grid element. If the shape is not small enough in block 58, the shape is intersected with all intruding grid elements to divide the shape area into pieces in block 62, and the areas are added in the intersections to each corresponding grid element in block 66.

Figure 7:
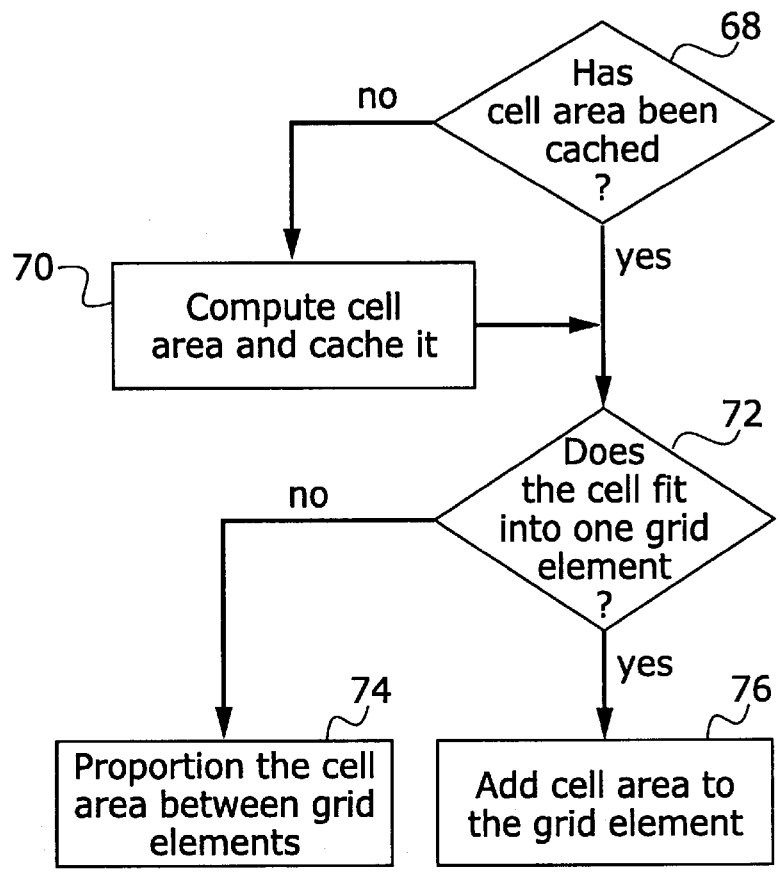
FIG. 7 is a block/flow diagram for adding cell areas to a map in accordance with the present invention.

Block 46 of FIG. 5 is now described in further detail with reference to FIG. 7. In decision block 68, a decision is made as to whether or not the current object (a cell in this case) has been cached. If the cell has not been cached, the cell area is computed and cached in block 70. If the cell area has been cached, a check is done in decision block 72 to determine if the cell fits in one grid element. If the cell fits in one grid element, the area is added to the map in block 76. If the cell fits into more than one grid element, the cell's area is proportioned among the grid elements it occupies.

Figure 8:
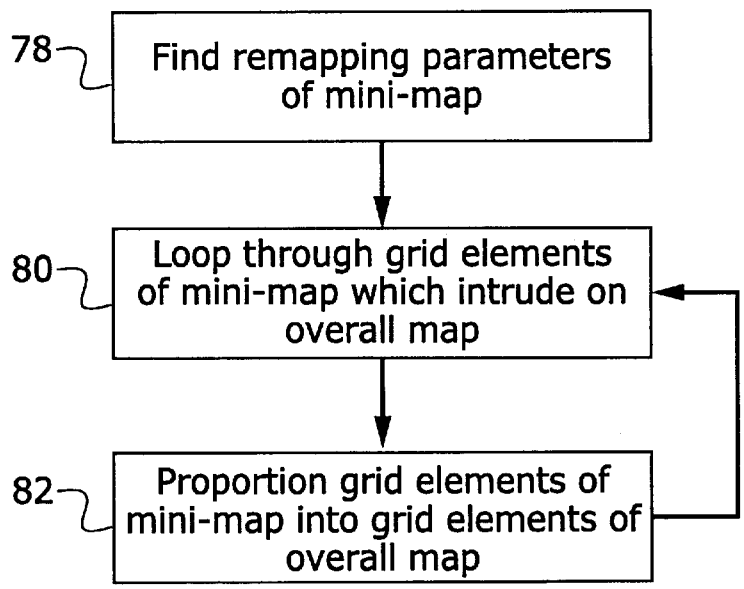
FIG. 8 is a block/flow diagram for adding mini-map areas to a map in accordance with the present invention.

Block 44 of FIG. 5 is now described in further detail with reference to FIG. 8. In block 78, remapping parameters are determined for describing the location and information about mini-maps in the overall map. The mini-map boundaries are identified relative to the overall map. In block 80, the transformed mini-map elements in the overall map are checked to determine if a portion of the grid elements are within the bounds of the overall map. In block 82, grid elements of the mini-map are proportioned into corresponding grids of the overall map. In this way, the density maps of mini-maps are determined, and mini-maps are included in the overall density map.

The present invention also includes an approximation factor, a, which may be utilized to reduce run time for the method described hereinabove without significantly affecting accuracy. The approximation factor, a, is defined such that if LER edges of a cell (or shape) are less than or equal to a×(grid_size), and the LER coincides with more than one grid point (an intersection of grid lines), the area of this cell (or shape) is split between relevant grid elements proportionally to the areas of LER-grid element intersections. In one example, when a=0, the calculation density map is precise (which means no approximation error exists based on the approximation factor a). If a=1, the loss of accuracy may be balanced between grid size and the approximation factor.

Figure 9:
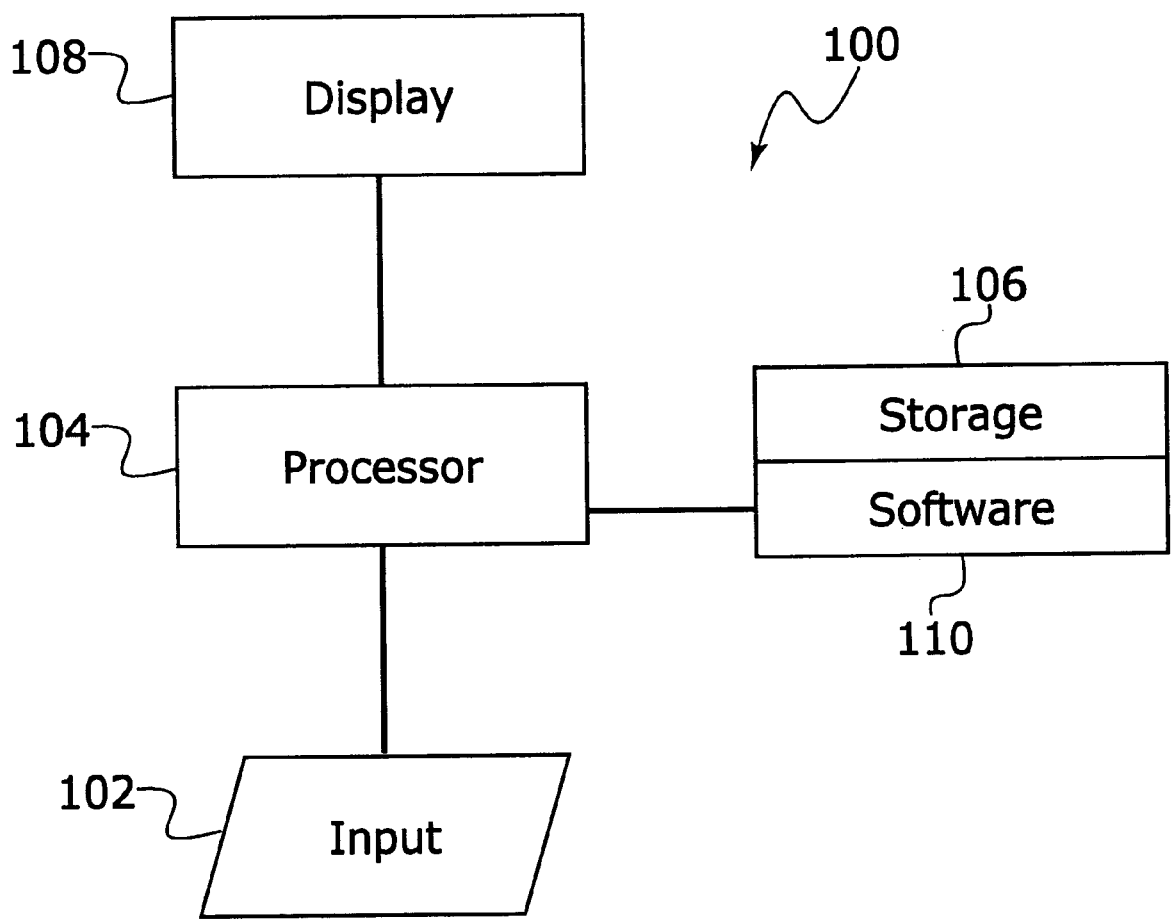
FIG. 9 is a block diagram for a system in accordance with the present invention.

Referring to FIG. 9, a block diagram of a system 100 in accordance with the present invention is shown. System 100 includes a user input device 102, preferably a keyboard and/or a mouse, for entering or selecting chip layout information to be processed by a processor 104. Processor 104 stores the user input information in a storage device 106. A display 108 is associated with the processor 104 for displaying prompts, forms, entered data, program messages, output, etc. for the user. Processor 104 implements the method of the present invention and employs memory space in memory storage device 106 for implementing algorithms programmed in software 110. The present invention may be incorporated into physical design systems for VLSI and advanced packaging.

Although described in terms of area the present invention is applicable to other features of a chip design. By suitable preprocessing, for example, by converting local properties such as ground rule errors or shape boundary elements, into shapes, the present method may be employed to efficiently measure any hierarchically-described local property.

Implementation of the method in accordance with the present invention preferably includes a computer program which is preferably in a programming language, such as, C or C++. The method of the present invention was coded and tested. Results of the test are presented in Table 1 below.

TABLE 1

| GRID SIZE | APPROXIMATION FACTOR, a | TIME (min:sec) | ERROR |
|---|---|---|---|
| 25 × 25 | 1.0 | 3:43 | 0.0045 |
| 25 × 25 | 0.5 | 5:39 | 0.0025 |
| 25 × 25 | 0.0 | 13:15 | 0.0 |
| 100 × 100 | 1.0 | 1:07 | 0.0029 |
| 100 × 100 | 0.5 | 2:19 | 0.0021 |
| 100 × 100 | 0.0 | 5:23 | 0.0 |

The results presented in Table 1 are for a 3.4 mm×3.4 mm chip with a size of about 15 Megabits in a standard file format, for example, a GDS II file format of Cadence, Inc. The chip included a hierarchical structure as described hereinabove. The program was compiled with a debug option (which was unoptimized), and ran on an 80 MHZ computer with 256 Megabits of random access memory. Grid elements were square and had their sides varied between 25 and 100 microns as shown in Table 1. The time shown is the actual run time for calculating the density map and does not include loading the file format software (which takes about 1 minute) which is a constant overhead common to both the invention and conventional methods. The approximation factor was also varied from between 0.0 (precise calculation) and 1.0 (approximated). The error is the standard deviation of the difference between the approximated and the precise density map. In interpreting the results, it should be apparent to one skilled in the art that the present invention significantly reduces run time. Conventional techniques for the same chip can take 1 to 2 hours to perform the density map calculation and are often less accurate.

Having described preferred embodiments of a novel system and method for determining density maps in hierarchical designs (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for calculating density maps in hierarchical designs comprising the steps of:
   deoverlapping objects in the design;
   providing an area of interest in the design;
   generating a grid in the area of interest to partition the area of interest into grid elements;
   determining whether the local properties of each object within the grid elements have been previously calculated;
   if previously calculated, adding the previously calculated value for the local properties to a corresponding grid element;
   otherwise, calculating the local properties of the object; and
   summing the local properties of the objects for each associated grid element such that the local properties are calculated only once for a given object throughout the design.

2. The method as recited in claim 1, further comprising the step of calculating a density map by dividing the local properties for objects in a grid element by an area of the grid element.

3. The method as recited in claim 1, wherein the step of deoverlapping includes altering shapes of objects to be disjoint while maintaining the local properties of the objects.

4. The method as recited in claim 1, wherein the step of providing the area of interest includes the step of enclosing the area of interest by a least enclosing rectangle (LER).

5. The method as recited in claim 1, wherein the step of generating a grid includes the step of generating a grid of polygons.

6. The method as recited in claim 1, wherein the local properties include areas of objects.

7. The method as recited in claim 1, further comprising the step of apportioning local properties of objects existing in more than one grid element to the associated grid element for each apportioned local property.

8. The method as recited in claim 1, wherein the objects include shapes and cells.

9. The method as recited in claim 8, further comprising the step of apportioning areas of shapes and cells existing in more than one grid element to the associated grid element for each apportioned area.

10. The method as recited in claim 1, further comprising the step of calculating density maps for one of user specified areas and automatically specified areas within the area of interest.

11. The method as recited in claim 10, further comprising the steps of:
    providing a mini-grid including mini-grid elements for each specified area and;
    apportioning areas of shapes determined to be in the mini-grid elements of each specified area among the grid elements of the area of interest.

12. A method for calculating density maps in hierarchical designs comprising the steps of:
    deoverlapping objects in the design;
    providing an area of interest in the design;
    generating a grid in the area of interest to partition the area of interest into grid elements;
    initializing a calculated area associated with each grid element to zero;
    moving through objects in the hierarchy to determine if the objects are a shape or a cell;
    if the object is a shape, apportioning the area of the shape to associated grids elements;
    if the object is a cell, determining if the cell includes mini-maps;
    if mini-maps are included, apportioning areas of cells and shapes in the mini-map to the associated grid elements of the area of interest;
    if the object is a cell, determining if the object is further divisible according to predetermined criteria;
    dividing the cells according to the predetermined criteria;
    apportioning the areas of the cells to associated grid elements;
    determining whether areas for each object in the grid elements have been previously calculated; and
    if previously calculated, adding the previously calculated value for the areas to a corresponding grid element.

13. The method as recited in claim 12, further comprising the step of calculating a density maps by dividing the areas for shapes and cells in a grid element by an area of the grid element.

14. The method as recited in claim 12, wherein the step of deoverlapping includes altering shapes of the objects to be disjoint while maintaining the area of the objects.

15. The method as recited in claim 12, wherein the step of providing the area of interest includes the step of enclosing the area of interest by a least enclosing rectangle (LER).

16. The method as recited in claim 12, wherein the step of generating a grid includes the step of generating a grid of polygons.

17. The method as recited in claim 12, further comprising the steps of:
    bypassing a computation previously performed to determine an area for one of a same cell and a same shape; and
    employing an area determined by a previously performed computation for shapes and cells such that the area is calculated only once for a given shape or cell throughout the design.

18. The method as recited in claim 12, further comprising the step of calculating density maps for mini-maps.

19. A system for calculating density maps in hierarchical designs comprising:
    means for deoverlapping objects in an area of interest in the design;
    a grid generated in the area of interest to partition the area of interest into grid elements, each grid element including objects having local properties associated therewith;

means for determining whether the local properties of each object within the grid elements have been previously calculated;

means for calculating the local properties for newly encountered objects; and if previously calculated, means for adding the previously calculated value for the local properties to a corresponding grid element such that the local properties are calculated only once for a given object throughout the design and the density map is determined when the local properties of the objects are summed in each grid element and divided by an associated grid element area.

20. The system as recited in claim 19, further comprises a memory for storing calculated local properties for objects in an associated grid element.

21. The system as recited in claim 19, wherein the objects include semiconductor devices.

22. The system as recited in claim 19, wherein the objects include mini-maps.

23. The system as recited in claim 19, further comprises means for apportioning for dividing local properties of objects existing in more than one grid element.

24. The system as recited in claim 19, further comprises a processor for summing local properties of the objects in each grid element and dividing by the associated grid element area.

25. The system as recited in claim 19, wherein the local properties include areas of the objects.

26. The system as recited in claim 19, wherein the objects include shapes and cells.

27. The system as recited in claim 19, wherein the hierarchical designs are included on integrated circuit chips.

* * * * *